(12) United States Patent
Schillhof et al.

(10) Patent No.: US 6,249,158 B1
(45) Date of Patent: Jun. 19, 2001

(54) CIRCUIT ARRANGEMENT FOR GENERATING AN OUTPUT SIGNAL

(75) Inventors: Udo Schillhof, Itzstedt; Werner Bradinal, Hamburg; Norbert Nieke, Norderstedt, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/434,881

(22) Filed: Nov. 5, 1999

(51) Int. Cl.$^7$ ...................................................... H03K 17/00
(52) U.S. Cl. .......................... 327/124; 327/175; 327/176; 327/355; 327/408
(58) Field of Search .................................... 327/124, 175, 327/176, 405, 408, 434, 355

(56) References Cited

U.S. PATENT DOCUMENTS

| | | | |
|---|---|---|---|
| 4,430,609 | 2/1984 | Van Kessel et al. | 323/350 |
| 4,987,320 | * 1/1991 | Oshima et al. | 327/356 |
| 5,111,443 | * 5/1992 | Yokogawa | 369/54 |

FOREIGN PATENT DOCUMENTS 3200071   9/1982   (DE) ................................ H03H/7/25

* cited by examiner

Primary Examiner—Terry D. Cunningham
Assistant Examiner—Quan Tra
(74) Attorney, Agent, or Firm—Edward W. Goodman

(57) ABSTRACT

A circuit arrangement for generating an output signal at an output by combining at least a first and a second input signal, includes controllable switches for applying a respective one of the input signals to the output, in which, for the purpose of switching the output from one of the input signals to the other, a first one of the controllable switches is gradually switched from the blocked to the conducting state and a second one of the controllable switches is switched complementarily thereto from the conducting to the blocked state. To implement such a circuit arrangement in such a way that distortions produced by tolerances and inaccuracies in matching the characteristics of the components used for switching can be avoided, while using a small number of components, the controllable switches are switched oppositely to each other between their completely conducting and their completely blocked state with a mutually complementary, gradually changed duty cycle.

20 Claims, 5 Drawing Sheets

CIRCUIT ARRANGEMENT FOR GENERATING AN OUTPUT SIGNAL

BACKGROUND OF THE INVENTION

1. Field of the Invention

The invention relates to a circuit arrangement for generating an output signal at an output by combining first and a second input signal, comprising at least a controllable switches for applying a respective one of the input signals to the output, in which, for the purpose of switching the output from one of the input signals to the other, a first one of the controllable switches is gradually switched from the blocked to the conducting state, and a second one of the controllable switches is switched complementarily thereto from the conducting to the blocked state.

2. Description of the Related Art

German Patent DE 32 00 071 A1 corresponding to U.S. Pat. No. 4,430,609 discloses a signal transmission device with a transmission characteristic which is adjustable in steps, comprising at least a group of controllable switches for applying a signal at various inputs to an output. This signal transmission device comprises control means with which one of the switches is, each time, rendered conducting, these switches being rendered conducting and non-conducting by means of a control signal. A control signal generator is provided for generating a first control signal which changes uniformly with respect to time and, by means of which, a given switch of the afore-mentioned group of controllable switches is gradually rendered conducting, and for generating a second control signal which is complementary to the first control signal, this second control signal simultaneously and uniformly rendered, non-conducting another switch of this group. The described operation of switching the switches or changing the control signals may be performed stepwise.

German Patent DE 196 35 050 A1 corresponding to U.S. Pat. No. 5,963,081, discloses a circuit arrangement having at least two signal paths which can each be fed by a controllable current source and are alternately switched to activity by means of logic signals selecting one of the controllable current sources. When changing over from one signal path to another during a transition interval, the controllable current sources of the relevant two signal paths are to be controlled by a temporally constantly changing control signal in such a way that currents, which can be supplied by these two controllable current sources, change constantly and with opposite sense. In accordance with German Patent DE 196 35 050 A1, a device, with which a gradual transition from one adjusting position to the next is achieved, is embodied by a control circuit comprising a control stage for each signal path. Each control stage comprises an analog multiplex branch via which the current activating the controllable current source associated with the relevant signal path, can be derived from a reference current source comprised in the control circuit and being common for the multiplex branches of all control stages. Moreover, each control stage has a bistable stage for constant control of the current in the multiplex branch in dependence upon the control signal, and for storing the state of operation of the multiplex branch achieved at the end of the transition interval outside the transition interval, as well as a switching stage for switching the control signal during the transition interval by means of the logic signals via the bistable stage to the multiplex branch of that signal path which, after termination of the transition interval, is to be activated in dependence upon the logic signals.

In the known circuit arrangements, fading between the signals at the various outputs for forming the output signal is performed by way of an "analog" switching operation. In this analog switching operation, the control characteristic of the components used for switching is an essential factor of influence. Due to inaccuracies of these control characteristics, particularly due to tolerance deviations and inaccurate matching of the characteristics with each other, distortions may occur which become manifest during fading, particularly in the case of large signal differences. These distortions may noticeably affect the reproduction quality of the output signal. Particularly, when such a circuit arrangement is used for volume control in audio signal reproducing devices, these distortions may become audible and thus deteriorate the aural impression.

SUMMARY OF THE INVENTION

It is an object of the invention to provide a circuit arrangement of the type described, avoiding distortions caused by tolerances and inaccuracies in matching the characteristics of the components used for switching, and this with a small number of components.

According to the invention, this object is achieved in a circuit arrangement according to the invention in that the controllable switches are switched oppositely to each other between their completely conducting and their completely blocked state with a mutually complementary, gradually changed duty cycle.

In accordance with the invention, the controllable switches, provided as components for the switching operation, are thus alternately and constantly rendered fully conducting or fully blocked. Since the central range of characteristics of these components between the two mentioned states for gaining the output signal from the input signals applied via the controllable switches thus does not play a role, non-linearities in this central range of characteristics or an inadequately complementary matching with each other cannot affect the operational behavior of the circuit arrangement according to the invention. Also, when using components having an insufficient linearity in the central range of characteristics or an insufficient matching with each other, a correct switching without signal errors can be achieved.

Based on these advantageous properties in switching the output of the circuit arrangement between two input signals, the circuit arrangement according to the invention may also be used for a static adjustment of a linear combination of at least two input signals and not only for a dynamic switching of the output from one of the input signals in a first static state to a second input signal in a second static state. A linear combination of more than two input signals is also possible, in which case, a corresponding number of controllable switches are switched, complementary to each other, between their fully conducting state and their fully blocked state in an opposite sense, so that at any instant, only one of the switches is conducting and the others are blocked.

In the case of a static adjustment of a linear combination of two or more input signals, the duty cycle with which the controllable switches are switched remains temporally constant.

In an advantageous embodiment, the output of the circuit arrangement, according to the invention, is connected to an integration arrangement for integrating, or low-pass filtering, the output signal. Those signal components which occur in the output signal due to switching of the controllable switches, can be filtered from this output signal by this integration arrangement. These signal components can then no longer influence a further processing of the output signal.

In another embodiment of the circuit arrangement according to the invention, the output is switched from one of the input signals to the other within a switching interval having a predeterminable duration. The duty cycle of the associated controllable switches is then gradually raised complementary to each other from zero to 100% or reduced from 100% to zero within this switching interval. The duration of the switching interval may be preferably adjustable, and advantageously, has a value of $\leq 1$ msec or $\geq 20$ msec.

In another embodiment, the circuit arrangement according to the invention comprises a control arrangement for generating two mutually complementary control signals for complementarily switching the controllable switches. These control signals are particularly constituted by pulse density or pulse frequency-controlled pulse signals.

It appears that the control of the pulse density or pulse frequency in the control signals as compared with an implementation of these control signals as pulse width-modulated pulse signals of constant frequency and variable duty cycle, has the advantage that, for comparable properties of the control signals thus formed, or for a comparable quality of the formed output signal for generating a pulse width-controlled control signal of constant pulse frequency, a clock signal having an essentially higher clock frequency is required as compared with the formation of a pulse density or pulse frequency-controlled pulse signal. The required number of components for generating a pulse width-controlled pulse signal is also essentially higher than that for generating a pulse density or pulse frequency-controlled pulse signal. In contrast, a pulse density or pulse frequency-controlled pulse signal can be generated with a much smaller number of components and at a much smaller clock frequency. For such a pulse signal, the pulse width is constant, whereas the repetition frequency of the pulses is adjustable. Then, only the number of pulses per unit of time in the pulse signal determines the temporal variation of the output signal of the circuit arrangement according to the invention.

Preferably, the control arrangement is implemented for changing the pulse density or pulse frequency of the control signals in a stepwise manner. This stepwise change can easily be realized with digital circuits and performed in such a fine gradation that it has the effect of a quasi-continuous change in the output signal to be generated.

Furthermore, exclusively, frequencies outside the audible frequency range are used both for the pulse density or pulse frequency of the control signals and for the repetition frequency of the steps in the stepwise change of the pulse density or pulse frequency of the control signals. When using the circuit arrangement according to the invention for processing audio signals, this measure essentially simplifies the suppression of audible influences on the audio signal by treating the signals in accordance with the invention. Particularly, the number of components for an integration arrangement to be connected to the output is reduced when frequencies introduced into the output signal due to switching are preferably far beyond the audible frequency range. On the other hand, it is efficient to choose the highest occurring frequency, particularly the repetition frequency of the pulses in the pulse signal, below a given limit. However, altogether, the controllable switches in the implementation of the invention described hereinbefore are switched in intervals which are short as compared with the duration of the switching operation.

In this respect, it is to be noted that an attenuation member for audio frequency signals, particularly for mixing panels, is known from German Patent DE 27 40 567 A1, in which the audio frequency signals are applied via a switch whose control input is connected to a pulse generator. This pulse generator supplies pulses with an adjustable pulse-pause ratio and at a repetition frequency which is at least equal to the double upper limit frequency of the frequency range of the audio frequency signals to be transmitted. The switch precedes a low-pass filter covering the range of frequencies to be transmitted.

However, in this known attenuation member, there is no switching between at least two input signals, but discrete attenuation stages for a signal are rather realized only by pulse width-modulated keying. Such a keying is also necessary for a static adjustment of a predetermined attenuation.

In accordance with a further embodiment of the invention, the control arrangement comprises an accumulation circuit which receives output data signals from a counting stage for up-accumulation, and from which a carry signal for controlling a bistable D-flip-flop is derived, while the counting stage, accumulation circuit and bistable D-flip-flop are clocked from a common clock signal, and the complementary control signals can be taken from the outputs of the bistable D-flip-flop. In this way, a very simple structure of the control arrangement is achieved. Due to the common clock signal, the count of the counting stage is constantly raised during switching, so that constantly increasing values are accumulated in the accumulation circuit. The repetition frequency of the carry signal thereby increases to an equal extent so that the pulse density of the pulses supplied by the bistable D-flip-flop increases constantly. The number of periods of the common clock signal, in which, for example, a positive level (high logic level) occurs, is thus increased constantly, namely, starting from zero up to the final position, in which, in each period of the common clock signal, a carry signal occurs, to 100%. This pulse signal and its inverse form of complementary control signals can then easily be taken from the outputs of the bistable D-flip-flop.

In this embodiment, the duration of the switching interval is determined by the frequency of the clock signal applied to the counting stage, the number of binary digits of the counting stage and the number of binary digits of the accumulation circuit. When, in accordance with a further embodiment of the invention, the clock signal is applied to the counting stage via an adjustable clock frequency divider stage, the duration of the switching interval can thereby be adjusted in a simple manner.

In accordance with a further embodiment, the circuit arrangement according to the invention comprises at least three controllable switches for applying a respective input signal, in which the output is switchable from a respective one of the input signals to an arbitrarily selectable one of the other input signals. In a modification of this embodiment, said at least three input signals are arranged in a predetermined sequence in accordance with their signal levels, and the output is switched from a respective one of the input signals to only the neighboring input signals in this sequence. Such a predetermined sequence may also be present in the first-mentioned variant in which switching is possible from each one of the input signals to an arbitrary selectable one of the other input signals; when switching takes place in accordance with this variant, arbitrary jumps in switching between the input signals are possible.

To realize switching modes of the types described hereinbefore, a further embodiment of the circuit arrangement according to the invention is characterized in that the control arrangement comprises a run-off control stage which, starting from an initial state of the circuit arrangement, in which a first selected input signal is applied to the output, receives an information signal about a second selected input signal via a data transmission path, this information signal being applied to the output in a final state of the circuit arrangement after switching said output. Such a data transmission path may be preferably an I²C bus via which the corresponding information signal is applied by a system control arrangement of a higher order.

Preferably, the run-off control stage comprises a first state storage element for storing an information signal for the initial state, and a second state storage element for storing the information signal for the final state. These information signals select the input signals to be applied to the output in the initial state and the final state, and perform the switching operation between these two input signals. After the switching operation has been performed, the information signal for the final state is transferred from the first state storage element to the second state storage element, whereupon, the first state storage element is ready for applying a new information signal for a new (further) final state. This new (further) final state characterizes the respective end of the relevant operation of switching from the respective first to the respective second selected input signal. When generating the output signal, a plurality of such switching operations may succeed one another in the desired manner. When the selected input signals are parts of a quantity of input signals arranged in a predetermined sequence, they may be neighboring or non-neighboring in this sequence. For switching between two neighboring input signals, a single switching operation is performed.

However, switching between two non-neighboring selected input signals may be performed in two ways. On the one hand, direct switching without switching to further, intermediate input signals in said sequence is possible. On the other hand, an input signal can be switched only to the neighboring input signal in the predetermined sequence, and an input signal can be switched to a non-neighboring input signal consecutively via each intermediate input signal in the predetermined sequence. In this case, an information signal for the respective final state of the relevant switching operation to be performed can be applied to the run-off control stage via the data transmission path at every single switching step. An essential simplification of the operation, particularly for the data transmission path and a higher-order system control arrangement connected thereto is, however, achieved in that the run-off control stage comprises a step control circuit by which two neighboring input signals in the predetermined sequence are switched from the initial state to the final state in individual switching operations. The run-off control stage must then receive only an information signal about the final state via the data transmission path, whereupon, the step control circuit automatically and consecutively performs the individual switching operations which are necessary for reaching the final state.

In this embodiment of the circuit arrangement according to the invention, in each of the individual switching operations, the information signal for the input signal to be applied to the output at the start of this individual switching operation (hereinafter: "leading input signal") is stored in the first state storage element. The information signal for the neighboring input signal in the predetermined sequence (hereinafter: "trailing input signal") is stored in the second state storage element. Preferably, in each of the individual switching operations, the information signals select the leading input signal or the trailing input signal, and the individual switching operation between these input signals is performed. After performing this individual switching operation, the information signal for the trailing input signal is transferred from the first state storage element to the second state storage element, whereupon the first state storage element is ready for applying the information signal for the next neighboring input signal in the predetermined sequence until the information signal for the final state has been transferred to the second state storage element. The overall switching procedure comprising the individual switching operations is thereby finished, and the first state storage element is then ready for an information signal for a new overall switching procedure or for the first intermediate step, i.e., the first individual switching operation of such a new overall switching procedure.

In a preferred embodiment of the circuit arrangement according to the invention, the input signals are derived by level gradation from a common input signal. Preferably, a potential or voltage division, for example, via a resistive voltage divider is performed as such a level gradation.

The circuit arrangement according to the invention is advantageously used in signal processing devices, particularly audio signal processing or signal control devices. It may be used for volume control, tone control, soft source switching and soft muting circuits, for example, in radio and television apparatuses. Moreover, it may be fundamentally used for all analog input signals.

These and other aspects of the invention are apparent from and will be elucidated with reference to the embodiments described hereinafter.

DESCRIPTION OF THE PREFERRED EMBODIMENTS

Figure 1:
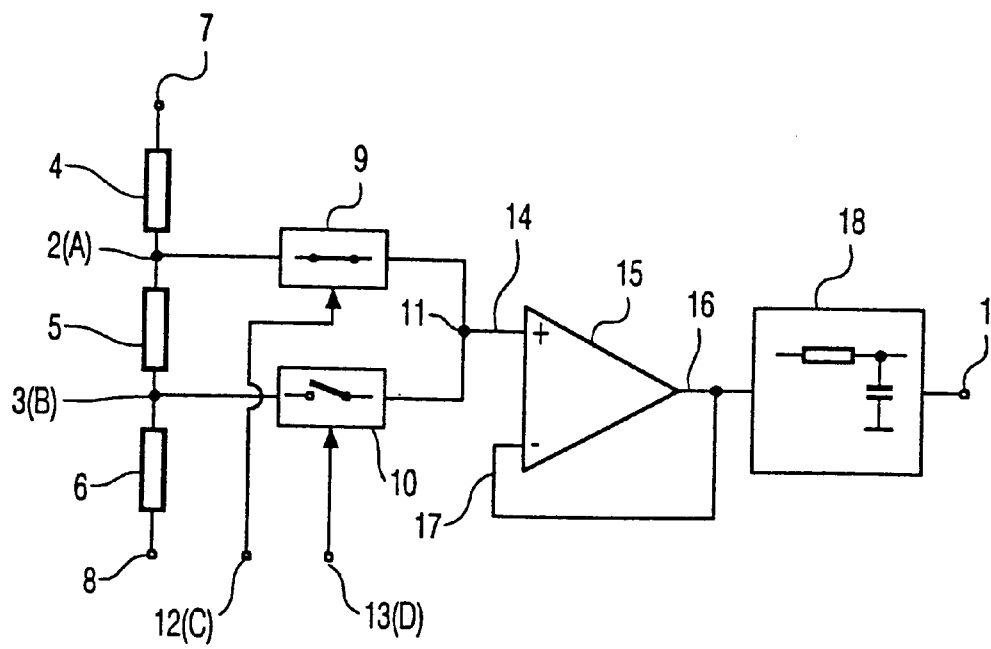
FIG. 1 is the circuit diagram of an embodiment of the invention.

In all Figures, corresponding elements are denoted by the same reference numerals.

FIG. 1 is a block diagram of a circuit arrangement for generating an output signal at an output 1 by combining input signals, in which, for the sake of simplicity, it is assumed that only a first and a second input signal are combined. The first input signal is applied via a first input terminal 2 and the second input signal is applied via a second input 3. The first input signal is denoted by A and the second input signal is denoted by B. In the embodiment shown in FIG. 1, the first and the second inputs 2, 3 are constituted by taps on a resistive voltage divider comprising resistors 4, 5, 6. A signal voltage or a signal current may be applied to this resistive voltage divider 4, 5, 6 via its output terminals 7, 8, for example, in such a form that said signal voltage is applied to the first output terminal 7 while the second output terminal 8 is connected to the reference voltage. The input signals A, B then constitute subdivisions of said signal voltage. The circuit arrangement according to the invention can switch between these subdivisions and thus generate the output signal at the output 1. In a modification of this embodiment, mutually independent input signals A, B may be alternatively applied to the inputs 2, 3.

The circuit arrangement of FIG. 1 also comprises, for each input 2, 3, a controllable switch 9, 10, respectively, connected to the associated input 2, 3 and to a common junction point 11, and applying, in their conducting state, the associated input signal A, B from the relevant input 2, 3 to the common junction point 11. By complementary, gradual switching of the controllable switches, the common junction point 11 is thus switched from one of the inputs 2, 3 to the other so that the signal at the junction point 11 is transferred from the one input signal to the other input signal (A or B). the controllable switches 9, 10 shown diagrammatically as mechanical switches in FIG. 1 are preferably implemented as electronic switches with control terminals 12, 13. Preferably, the controllable switches 9, 10 are conducting when their control terminals 12, 13 receive a control signal having a high logic level H, and are blocked when their control terminals 12, 13 receive a control signal having a low logic level L. In operation, a first control signal C is applied to the control terminal 12 of the first controllable switch 9, and a second control signal D is applied to the control terminal 13 of the second controllable switch 10.

In the embodiment 1, of FIG. the common junction point 11 of the controllable switches 9, 10 is connected to a non-inverting input 14 of an operational amplifier 15 having an output terminal 16 short-circuited with an inverting input 17, and thus represents a low-ohmic source for the output signal to be generated.

The output terminal 16 of the operational amplifier 15 is connected to the output 1 via an integration arrangement 18. The integration arrangement 18 is shown as an RC combination in a block diagram and, in the simplest case, may comprise an ohmic series resistor and a shunt capacitance from the output 1 connected to a reference potential, preferably ground. If a more effective integration or low-pass filtering of the output signal is required, more elaborate filter circuits may also be used for the integration arrangement 18.

Figure 2:
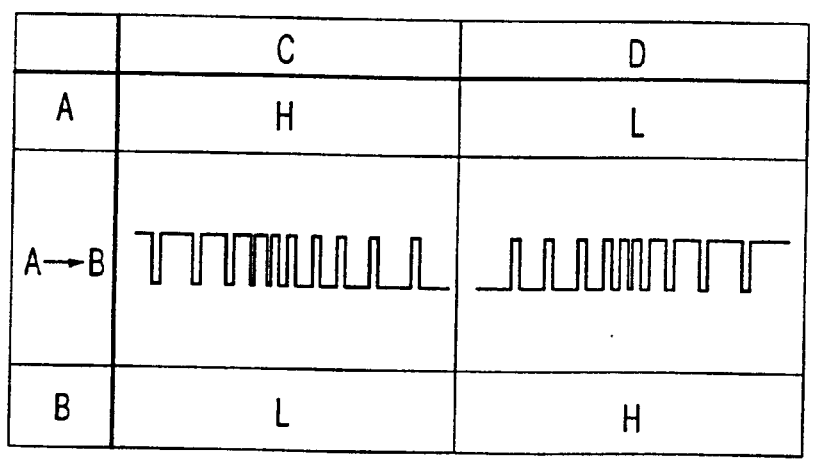
FIG. 2 is a diagrammatic representation, in the form of a table, of the mode of operation of the circuit arrangement shown in FIG. 1.

To explain the mode of operation of the circuit arrangement of FIG. 1, reference is hereinafter made to the table of FIG. 2. This table shows, diagrammatically, the control signals C and D to be applied to the control terminals 12 and 13, respectively, in dependence upon the selected input signals A and B when switching the output 1 between these input signals A and B. When the first control signal C is temporally constantly at the high logic level H and the second control signal D is complementary thereto, i.e., temporally constantly at the low logic level L, the control switches 9, 10 assume the positions shown in FIG. 1, i.e., the first controllable switch 9 is in the conducting state and the second controllable switch 10 is in the blocked state. Thus, the first input signal A from the first input 2 is applied as an output signal to the output 1, or this output signal is generated from the first input signal A. In a second, temporally constant switching state, the first control signal C assumes a low logic level L and the second control signal D assumes a high logic level H. The first controllable switch 9 is then in the blocked state, whereas, the second controllable switch 10 is in the conducting state. The output signal at the output 1 is then generated from the second input signal B, while the signal path is interrupted for the first input signal A.

For switching the output 1, for example, from the first input signal A to the second input signal B, a pulse signal is applied as a first control signal to the control terminal 12 of the first controllable switch 9, i.e., a control signal which switches up and down between the high and the low logic level. As is shown in the table of FIG. 2, the pulse signal, which serves as first control signal C, has individual, short pulses with a low logic level P, starting from the high logic level H. The second control signal D, which is applied to the control terminal 13 of the second controllable switch 10, is complementary thereto, i.e., it has a low logic level L at which pulses having the high logic level H are present in the periods of time in which pulses with a low logic level L occur in the first control signal C. Thus, the second control signal D is at any instant the logic inverse form of the first control signal C. The density or frequency of the pulses of the first control signal C with the low logic level L and the pulses of the second control signal D with the high logic level H is now gradually raised to a high value, starting from a very low value, until finally the pulses succeed each other so rapidly that the first control signal C has a constant low logic level L and the second control signal D has a constant high logic level H. When this state is reached, the output 1 is switched from the first input 2 conveying the first input signal A to the second input 3 conveying the second input signal B. The time interval within which the control signals C, D have the described pulsatory variation is referred to as switching interval.

The control signals C, D in the afore-described form of pulse density or pulse frequency-controlled pulse signals only represent a possible variation of these control signals C, D. Generally, the control signals C, D are implemented during the switching interval as pulse signals with a mutually complementary, gradually changed duty cycle between their temporally constant states. However, the number of components required for generating pulsatory control signals C, D having a constant pulse frequency and a variable duty cycle appears to be considerably higher. In contrast, the number of components required for generating pulses having a constant duration and a variable repetition frequency is essentially smaller.

In the manner mentioned hereinbefore, there is thus a quasi-continuous fading between the input signals A and B during the switching interval. The value of the output signal obtained at the output 1 corresponds to a weighted average or a linear combination of the signal values of both input signals A and B, the weighting or parameters for the linear combination resulting from the instantaneous value of the duty cycle (corresponding to the pulse density or pulse frequency and the pulse duration). Thus, a pulsatory signal switched between the values of the two input signals A and B is produced at the common junction point 11 in the switching interval, which signal is smoothed in the subsequent integration arrangement.

Besides a switching operation of the type described, it is also possible to perform a temporally constant combination or linear combination of both input signals A and B with the circuit arrangement described, so that a signal having a signal value representing a temporally constant weighted average between the values of said input signals appears as output signal at the output 1. However, in the previously described switching process, the output signal will continuously vary from the value of one input signal A or B to the value of the other input signal B or A, respectively.

The circuit arrangement shown, diagrammatically, in FIG. 1, which preferably serves for amplitude adjustment of a signal present at the output terminals 7, 8 of the resistive voltage divider, and which may be, particularly, an audio signal, can be extended in conformity with the desired amplitude leveling of this signal by further ohmic resistors in the resistive voltage divider and by further controllable switches for every further tap between two ohmic resistors. In that case, all controllable switches may be connected to the common junction point 11.

Such an extension of the circuit arrangement of FIG. 1 is very simple and effectively possible, particularly with controllable switches implemented as bidirectional switches with complementary MOS field effect transistors made in a BIMOS technique. When using such controllable switches, the use of operational amplifiers having multiple inputs, as described in German Patent DE 32 00 071 A1, is superfluous. Consequently, the number of required operational amplifiers and the overall number of components for the circuit arrangement is noticeably reduced. For a construction an integrated circuit arrangement, a smaller crystal surface area is thus also required and the circuit arrangement formed therefrom has a lower power consumption accompanied by an improved noise characteristic. Moreover, due to the BIMOS process, resistors having an essentially reduced voltage dependence are available so that harmonic distortions (distortion factor) in the circuit arrangement can be decreased. Saving of power consumption and crystal surface area also applies to logic gates which, together with the circuit arrangement according to the invention, are arranged on the integrated semiconductor circuit.

Figure 3:
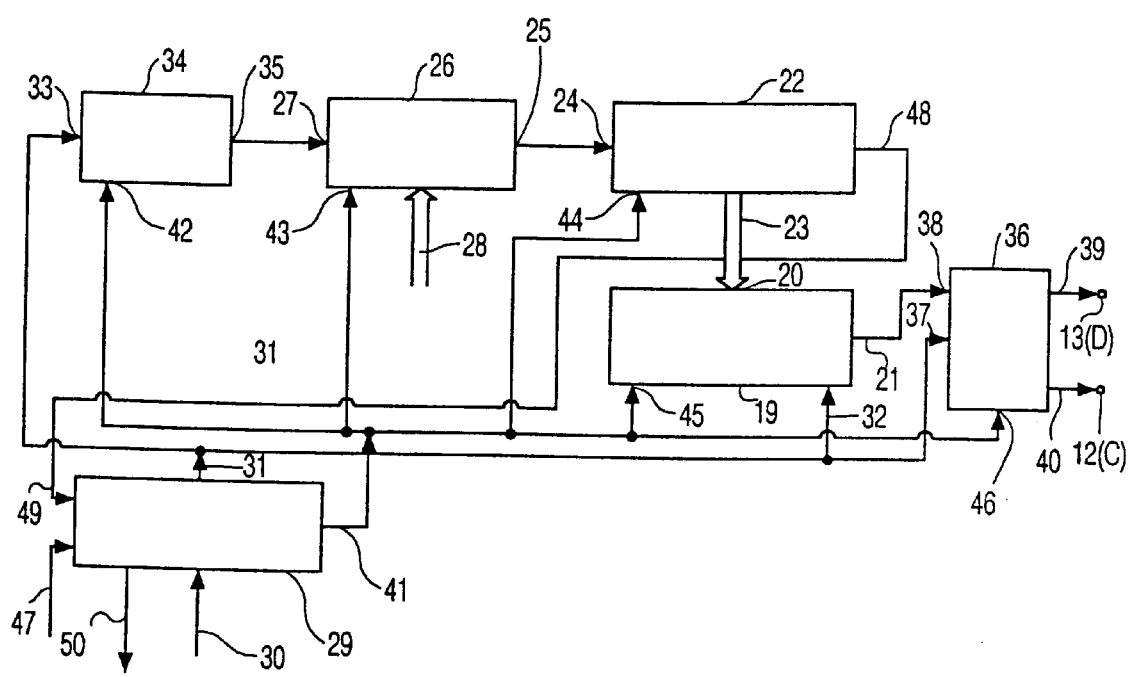
FIG. 3 shows an embodiment of a control arrangement according to the invention.

FIG. 3 shows a block diagram of a control arrangement for generating the control signals C, D which are applied to the control terminals 12, 13 of the controllable switches 9, 10 in FIG. 1 and by which these controllable switches 9, 10 are switched complementarily to each other. The embodiment of this control arrangement shown in FIG. 3 represents a particularly advantageous implementation of a pulse density or pulse frequency modulator. The most important part of the control arrangement is an accumulation circuit 19 having an input 20 for a signal to be accumulated, and an output 21 for supplying a carry signal. The accumulation circuit 19 may be implemented in known manner by an adder circuit fed back via a memory register. The input 20 of the accumulation circuit 19 is connected to an output 23 of a counting stage 22. Via this connection, the input 20 of the accumulation circuit 19 receives output data signals from the counting stage 22 as signals to be accumulated which represent their current counting position. For use of the circuit arrangement according to the invention in an audio signal-processing device, the accumulation circuit 19 and the counting stage 22 have a word length of preferably 9 bits or more. The word length of the accumulation circuit 19 corresponds to that of the counting stage 22. In the case of a word length of 9 bits, the counting stage 22 thus comprises 512 counting steps.

A clock signal input 24 of the counting stage 22 is connected to an output 25 of an adjustable clock frequency divider stage 26. The adjustable clock frequency divider stage 26 further has an input 27 for a clock signal. It has also an adjusting signal input 28, via which a digital adjusting signal can be applied for adjusting the frequency division factor by which the frequency of the clock signal applied to the input 27 is divided in the adjustable clock frequency divider stage so as to obtain a frequency-divided signal derived via the output 25 and to be applied to the counting stage 22 via its clock signal input 24.

The control arrangement shown in FIG. 3 further comprises a logic stage 29 which serves for controlling the functions in the control arrangement. A clock signal input 30 of the logic stage receives a basic clock signal from a clock signal source (not shown). In the logic stage 29, an accumulator clock signal is derived from this basic clock signal, this accumulator clock signal preferably having the same frequency as the basic clock signal, but may also be formed therefrom by frequency division or the like. This accumulator clock signal is supplied from an output 31 of the logic stage 29. The accumulator clock signal is supplied from the output 31 of the logic stage 29 to a clock signal input 32 of the accumulation circuit 19, and to an input 33 of a frequency pre-divider 34 in which the clock signal is formed from the accumulator clock signal by frequency division by a predetermined division factor, this clock signal being supplied, via an output 35 of the frequency pre-divider 34 to the input 27 of the adjustable clock frequency divider stage 26. In contrast to an adjustable clock frequency divider stage 26, the division factor of the frequency pre-divider 34 is fixed.

Moreover, a bistable D-flip-flop 36 is clocked at its clock input 37 with the accumulator clock signal from the output 31 of the logic stage 29. A data input (D input) 38 of the bistable D-flip-flop 36 is connected to the output 21 of the accumulation circuit 19 for its carry signal. Thus, clocked by the accumulator clock signal, the switching state of the bistable D-flip-flop 36 is determined by the value of the carry signal from the accumulation circuit 19. A Q output 39 of the bistable D-flip-flop 36 is connected to the control terminal 13 of the second controllable switch 10 and supplies the second control signal D, whereas an inverting Q output 40 of the bistable D-flip-flop 36 is connected to the control terminal 12 of the first controllable switch 9 and supplies the first control signal C.

In the embodiment in accordance with FIG. 3, the shown control arrangement is implemented for switching the output 1 between the first input 2 and the second input 3 within a switching interval of a predeterminable duration. To explain the mode of operation of the control arrangement, the case of switching from the first input signal A to the second input signal B, diagrammatically shown in the central column of the table of FIG. 2, will be assumed. At the start of the switching interval, the first control signal C must thus have a temporally constant high logic level P, whereas the second control signal D is temporally constant at the low logic level L. To take up this state in a defined manner, the logic stage 29 generates a reset signal outside the switching interval and supplies it from a reset output 41. Via reset inputs 42, 43, 44, 45 and 46 of the frequency pre-divider 34, the adjustable clock frequency divider stage 26, the counting stage 22, the accumulation circuit 19 and the bistable D-flip-flop 36, these stages are set by the reset signal to a defined initial state outside the switching interval and held in this state until a start input 47 of the logic stage 29 receives a start signal as a command signal for starting a switching operation. The logic stage 29 then interrupts the reset signal and said stages are enabled. At this first instant after termination of the reset signal, the accumulation circuit 19 and the counting stage 22 are in their initial state, i.e., at an accumulated value of 0 or in the counter position 0, respectively.

The accumulation circuit 19 is now clocked with the accumulator clock signal and, by frequency division in the adjustable clock frequency divider stage 26 and the frequency pre-divider 34, the clock signal for the clock signal input 24 of the counting stage 22 is derived therefrom. The accumulation circuit 19 thus starts accumulating the values of the output data signal supplied from the output 23 of the counting stage 22 to the input 20 in the clock rhythm of the accumulator clock signal. The accumulation circuit 19 accumulates the value 0 until the first pulse of the clock signal is received at the clock signal input 24, so that the contents, i.e., the value stored in the accumulation circuit 19, does not initially change. After the first pulse of the clock signal has been received at the clock signal input 24, the counting stage 22 counts one counting step further and the output data signal at the output 23 assumes the binary value 1. Subsequently, the accumulation circuit 19 raises the relevant current values stored in the accumulation circuit 19 by this binary value 1 in each period of the accumulator clock signal. Without a further pulse at the clock signal input 24 and in the case of a word length of 9 bits, the accumulation circuit thus will supply a carry signal from its output 21 after 512 periods of the accumulator clock signal, this carry signal lasting exactly one period of the accumulator clock signal. This carry signal is applied to the data input 38 of the bistable D-flip-flop 36 and, together with the simultaneously occurring pulse of the accumulator clock signal at the clock input 37, it is applied to the bistable D-flip-flop 36. In the next period of the accumulator clock signal, the carry signal at the output 21 is terminated again and the bistable D-flip-flop 36 is reset to the previous state. This means that, due to the carry signal at the output 21 of the accumulation circuit 19, pulses having the duration of one period of the accumulator clock signal occur at the outputs 40 and 39 supplying the control signals C, D, namely, negative pulses from a high logic level H to a low logic level L at the inverting Q output 40 and conversely at the Q output 39.

The described signals are repeated as long as no further pulse is received at the clock signal input 24 so as to further switch the counting stage by one counting step. The instant when this occurs depends on the frequency division factor at which the adjustable clock frequency divider stage 26 is adjusted via its adjusting signal input 28.

After switching, the output 23 of the counting stage 22 applies an output data signal representing the binary value 2 to the input 20 of the accumulation circuit 19. This binary value 2 is thus subsequently accumulated by the accumulation circuit 19. When the counting stage 22 is held in this state, a carry signal, i.e., a pulse in the control signals at the outputs 39, 40 of the bistable D-flip-flop 36, occurs at the output 21 of the accumulation circuit every 256 periods of the accumulator clock signal. The duration of the pulses in the control signals C and D thus remains unchanged but their repetition frequency is increased.

This process continues when further pulses of the clock signal are received at the clock signal input 24 of the counting stage 22 and switch this counting stage by a corresponding number of counting steps. In a corresponding manner, the value of the output data signal increasing counting step by counting step is accumulated in the accumulation circuit 19 and a carry signal is supplied from the output 21 at a corresponding, more frequent rate. This occurs, after approximately every 170 periods of the accumulator clock signal, for example, at a counter position of the counting stage 22, i.e., at an output data signal with a binary value 3 and said word length of 9 bits. For an output data signal with a binary value 4, this temporal distance is decreased, i.e., the repetition frequency of the pulses of the control signals is decreased to 128 periods of the accumulator clock signal, etc. From counting step to counting step of the counting stage 22, the repetition frequency of the pulses in the control signals C, D supplied by the bistable D-flip-flop 36 thus increases. When the current counter position of the counting stage 22 corresponds to half the overall number of possible counting steps of the counting stage 22, i.e., when, for example, the output data signal assumes the value 256 at a word length of 9 bits of the counting stage 22, a pulse is generated in the control signals C, D in every second period of the accumulator clock signal. The repetition frequency of the pulses in the control signals C, D then reaches its highest value. Up to this state, the repetition frequency of the pulses in the carry signal at the output 21 of the accumulation circuit 19 and hence in the control signals C, D is a direct measure of the value of the output data signal at the output 23 of the counting stage 22.

Further pulses of the clock signal at the clock signal input 24 trigger further counting steps by which also the value of the output data signal is further increased. The number of pulses in the carry signal at the output 21 of the accumulation circuit 19 then further increases. Then, cases occur in which the carry signal in two and more later consecutive periods of the accumulator clock signal indicates an overflow of the accumulation circuit 19. Directly successive pulses without edges in between are thereby generated in the control signals C, D. This means that the control signals C, D more and more continuously assume the logic level in longer time intervals, which logic level occurred only in the individual pulses at the start of the switching process. This process is synonymous with a decreasing pulse frequency of the pulsatory control signals C, D.

The switching process is ended when the counting stage 22 has reached its final position. In this position, a carry signal is generated at the output 21 in each period of the accumulator clock signal, so that constant logic levels are obtained for the control signals C, D. Moreover, the counting stage 22 supplies, from its transfer output 48, a carry signal which is applied as a stop signal to a stop input 49 of the logic stage 29. This stop signal holds the control arrangement of FIG. 3 in the last described state, particularly, by interrupting the accumulator clock signal at the output 31. The termination of the switching process may also be signaled via a signaling output 50 to control arrangements outside the arrangement described.

The frequency division factor of the adjustable clock frequency divider stage 26 is adjustable within predeterminable values, for example, between 1 and 32 by the digital adjusting signal via the adjusting signal input 28. The larger the frequency division factor, the lower the frequency of the clock signal applied to the clock signal input 24 of the counting stage 22 in proportion to the frequency of the accumulator clock signal. Consequently, the counting steps of the counting stage 22 will be passed through at a slower rate as the frequency division factor is chosen to be higher. This results in a longer duration of the switching interval which can be determined via the adjusting signal.

To achieve a possibly disturbance-free operation of the circuit arrangement according to the invention, only frequencies outside the audible frequency range are used both for the pulse density and pulse frequency of the control signals C, D and for the repetition frequency of the steps of the stepwise change of pulse density and pulse frequency of the control signals C, D, when the circuit arrangement according to the invention is to be used for audio signal processing. This decisively determines the choice of the frequency of the accumulator clock signal, the word length of the counting stage 22 and the accumulation circuit 19, the frequency division factor of the adjustable clock frequency divider stage 26, and the division factor of the frequency pre-divider 34. Also, high pulse frequencies are desired in the control signals C, D so as to be able to use a small number of components for the integration arrangement 18.

Especially for an embodiment of a circuit arrangement according to the invention for use as a volume control of an audio signal, it is necessary that the pulse frequency of the control signals C, D must always be more than 20 kHz so as not to be audible. However, values above 100 kHz are advantageous. It is furthermore required that the duration of the switching intervals can be adjusted between a value below a millisecond and a value above 20 msec. As already explained hereinbefore, the duty cycle for the control signals C, D is varied within 0 and 100% within a switching interval. Audio tests have proven that not only the pulse frequency of the control signals C, D, but also the repetition frequency of the variation of the pulse density or the pulse frequency of the control signals C, D, i.e., the repetition frequency of the variations of the repetition frequency of the pulses in the carry signal at the output 21 of the accumulation circuit 19, must assume a value above 16 kHz. Consequently, for the largest predeterminable value of the duration of the switching interval of at least 20 msec, the duty cycle of the control signals C, D must be variable between 0 and 100% in at least 400 steps so as to prevent these steps from being audible. When there is a level difference of 1 dB between the input signals A, B, the level is changed in steps of less than 0,0025 dB during the switching operation.

For the same embodiment, it has further appeared that the frequency of the basic clock signal should not exceed a value of 4.5 MHz. It is advantageous to fix the frequency of the basic clock signal at 4.332 MHz. This frequency can be derived from the use of an RDS decoder, from which also, by division by the factor 114, the stereo reference frequency for the stereo decoder PLL of 38 kHz can be derived.

For a control arrangement as shown in FIG. 3, dimensioned in accordance with this embodiment, 3-bit frequency pre-dividers 34 and a 5-bit clock frequency divider stage 26 are chosen. The frequency division factor of the adjustable clock frequency divider stage 26 can thereby be adjusted between the value 1 and the value 32, whereas, the division factor of the frequency pre-divider 34 is fixed at the value 8. With the above-mentioned numerical values, a duration of between 30.3 msec and 0.95 msec is obtained for the switching interval. The above-mentioned word length of 9 bits for the counting stage 22 and the accumulation circuit 19 is presupposed, assuming that the frequency of the accumulator clock signal corresponds to the frequency of the basic clock signal.

Figure 4:
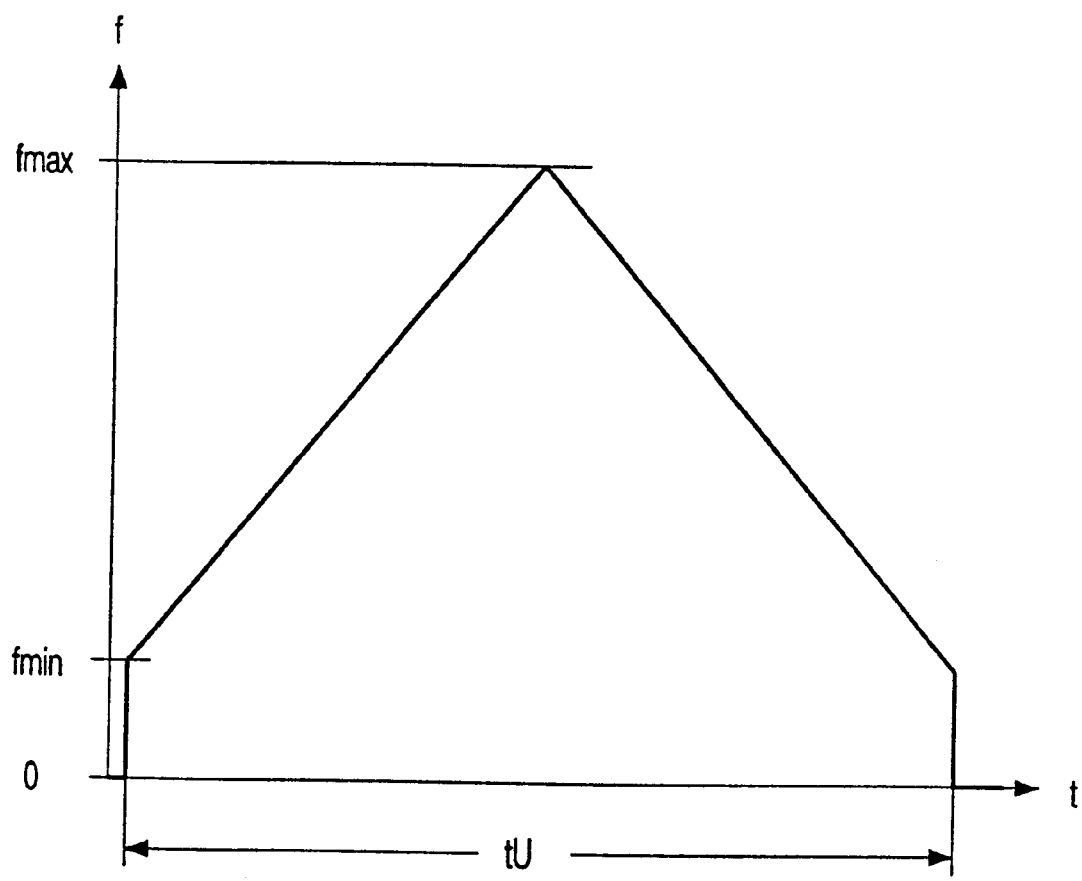
FIG. 4 shows a diagram representing the instantaneous frequency of the control signals supplied by the control arrangement of FIG. 3 during the switching process.

FIG. 4 diagrammatically shows the variation of the pulse frequency f of the control signals C, D in the course of a switching interval having a duration of tU with respect to time t. At the first pulse of the clock signal at the clock signal input 24 of the counting stage 22, the pulse frequency f of the control signals C, D jumps from 0 to the value fmin which is 8.46 kHz in the embodiment with the dimensioning mentioned hereinbefore. With an increasing value of the output data signal of the counting stage 22, the pulse frequency f towards the middle of the switching interval tU increases to a maximum value fmax of 2.17 MHz, half the frequency of the accumulator clock signal. From this instant onwards, the pulse frequency f is reduced, as described, to the minimum value fmin of 8.46 kHz when the second highest value of the output data signal occurs at the output 23, i.e., the value assumed by this output data signal before the last counting step, by which value the carry signal is triggered at the transmission output 48 of the counting stage 22. Subsequently, the frequency of the control signals C, D decreases to zero again, i.e., the control signals C, D assume constant values.

Figure 5:
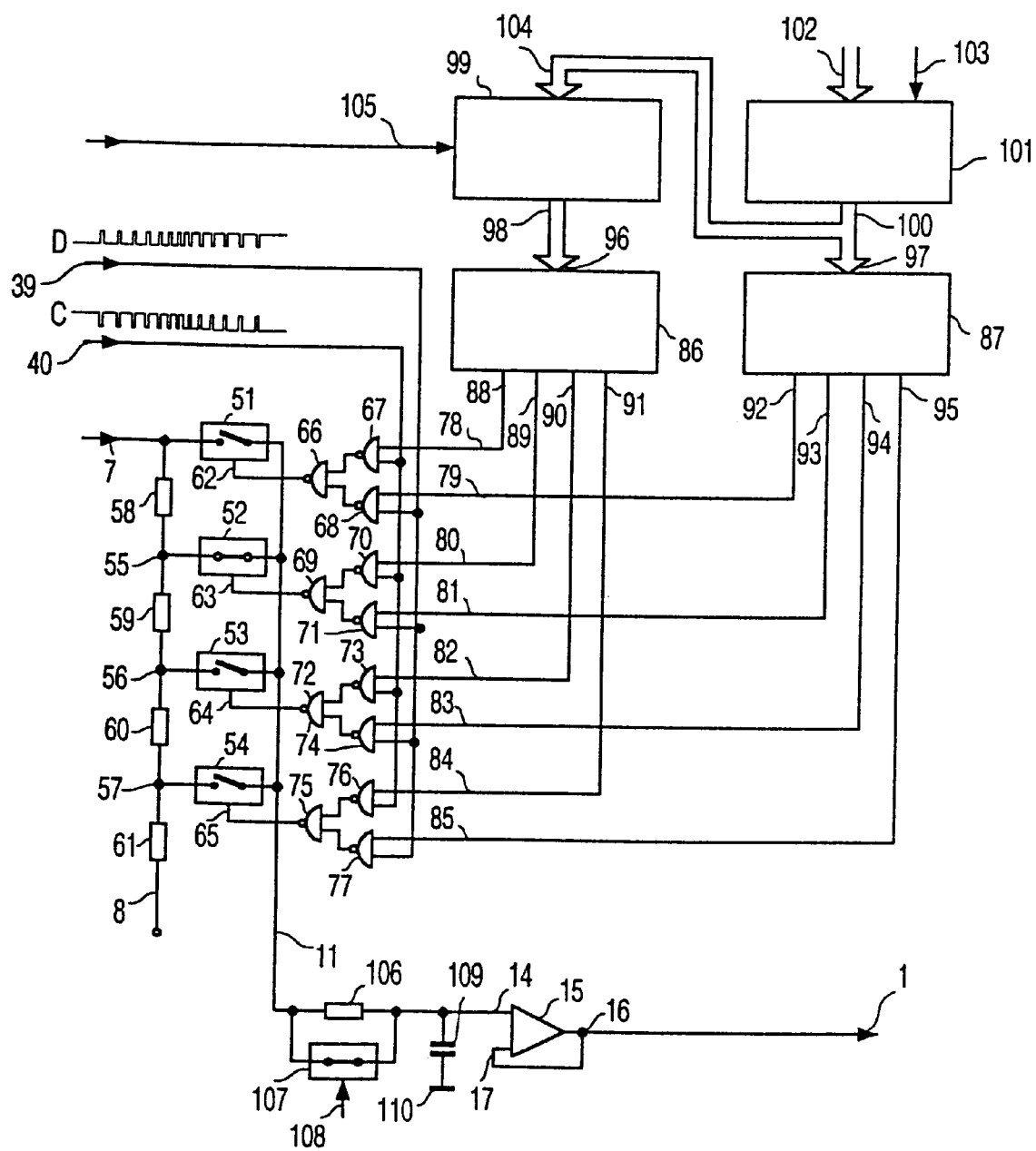
FIG. 5 shows an embodiment of a run-off control stage according to the invention.

FIG. 5 shows an embodiment of a run-off control stage which, together with the elements shown in FIG. 3, forms part of the control arrangement. Unlike the circuit arrangement in FIG. 1, FIG. 5 shows the structure and mode of operation of the run-off control stage in an embodiment with four controllable switches 51, 52, 53 and 54 which, however, fully correspond to the controllable switches 9, 10 of FIG. 1. Similarly as in FIG. 1, FIG. 5 also shows that the controllable switches 51, 52, 53, 54 are connected to a common junction point 11 at one end and to taps 55, 56 and 57 at the other end, and to the first output terminal 7 of a resistive voltage divider comprising ohmic resistors 58, 59, 60, 61. The common junction point 11 is again coupled to the output via an operational amplifier 15.

The run-off control stage of FIG. 5 further comprises gating circuits via which the outputs 39, 40 of the bistable D-flip-flop 36 for the control signals C, D are optionally connectable to control terminals 62, 63, 64, 65 of the controllable switches 51, 52, 53, 54. These gating circuits are arranged in such a way that a group of three NAND-gates 66 to 68, 69 to 71, 72 to 74 and 75 to 77 is assigned to each control terminal 62, 63, 64, 65, respectively. The inputs of the first NAND-gates 66, 69, 72 and 75 in each group of NAND-gates 66 to 68, 69 to 71, 72 to 74 and 75 to 77 are connected to the output of one of the other NAND-gates 67, 68, and 70, 71 and 73, 74 and 76, 77, respectively, of the group of NAND-gates. The outputs of the first NAND-gates 66, 69, 72 and 75 are connected to the control terminals 62, 63, 64 and 65 of the assigned controllable switches 51, 52, 53, 54, respectively. An output of every second NAND-gate 67, 70, 73, 76 of the groups of NAND-gates is connected to the inverting Q output 40 of the bistable D-flip-flop 36 for applying the first control signal C. Each input of the third NAND-gates 68, 71, 74, 77 of the groups of NAND-gates is connected to the Q output 39 of the bistable D-flip-flop 36 for the second control signal D. The second inputs of the second and third NAND-gates 67, 68 and 70, 71 and 73, 74 and 76, 77 of the groups of NAND-gates constitute first terminals 78, 80, 82, 84 and second terminals 79, 81, 83, 85 of the groups of NAND-gates 66 to 77, respectively. Signals can be applied via the terminals 78 to 85, via which signals given ones of the controllable switches 51 to 54 can be selected by the groups of NAND-gates 66 to 77 so as to apply the control signals C and D to them, whereas the other ones of the controllable switches 51 to 54 remain blocked.

This selection of the controllable switches 51, 52, 53, 54 via the NAND-gates 66 to 67 starts from decoder stages 86, 87 which are constituted in the embodiment of FIG. 5 as 1-of-4 decoders with four outputs 88, 89, 90, 91 and 92, 93, 94, 95. Data words having a word length of 2 bits in the embodiment of FIG. 5 are applied to the decoder stages 86, 87 via inputs 96, 97, respectively. Dependent on the binary value of these data words, one of the outputs 88 to 91 or 92 to 95 of the decoder stages 86 or 87 is switched to a high logic level H, whereas the other ones of the outputs 88 to 91 and 92 to 95 are at a low logic level L. The outputs 88 to 91 of the first decoder stage 86 are connected to the first terminals 78, 80, 82, 84 of the first, second, third and fourth groups of NAND-gates. The outputs 92, 93, 94, 95 of the second decoder stage 87 are connected to the second terminals 79, 81, 83, 85 of the first, second, third and fourth groups of NAND-gates. Thus, the supply of the first control signal C to one of the controllable switches 51 to 54 is selected by the first decoder stage 86, whereas the second decoder stage 87 can select the supply of the second control signal D to one of these controllable switches 51 to 54.

The input 96 of the first decoder stage 86 is connected to an output 98 of a first state storage element. In a corresponding manner, the input 97 of the second decoder stage 87 is connected to an output 100 of a second state storage element 101. The first state storage element 99 is used for storing an information signal for an initial state of a switching operation, i.e., for that one of the controllable switches 51, 52, 53, 54 which is continuously conducting in this initial state. The second state storage element 101 stores an information signal for the final state of the switching operation, i.e., for that one of the controllable switches 51, 52, 53, 54 which is conducting in the final state. These information signals are formed in the embodiment of FIG. 5 by the data words of two-bit word length which are decoded in the decoder stages 86, 87. The information signal for the final state is applied via a bus input 102 to the second state storage element 101 when, simultaneously a corresponding load signal is applied via a load signal input 103 to the second state storage element 101. Moreover, the output 100 of the first state storage element 99 is connected to an input 104 of the first state storage element 99. Via this connection, the information signal for the final state can be supplied from the second state storage element 101 to the first state storage element 99 when supplying a further load signal via a load signal input 105 of the first state storage element 99.

Before the start of a switching operation, the first control signal C has assumed a high logic level H, whereas the second control signal D has a low logic level L. The outputs of the third NAND-gates 68, 71, 74 and 77 of the groups of NAND-gates are then at a high logic level H because the second control signal D has the level L. Thus, the signals from the outputs 92, 93, 94, 95 of the second decoder stage 87 do not have any influence on the controllable switches 51, 52, 53, 54, i.e., also the information signal for the final state stored in the second state storage element 101 has no influence on the controllable switches 51 to 54. Thus, new information signals can be stored in the second state storage element 101 without influencing the output signal at the output 1, and without disturbances that are caused thereby having any effect on the outputs 92 to 95.

In contrast, the first control signal C is at the high logic level H so that the second NAND-gates 67, 70, 73 and 76 of all groups of NAND-gates are free for passing on the signals from the outputs 88 to 91 of the first decoder stage 86. The information signal for the initial state, which is stored in the first state storage element 99, may thus influence the states of the controllable switches 51 to 54 via the first decoder stage 86 and the gating circuits 66 to 77.

The case is assumed where a data word representing a binary-coded value of 1 is stored in the first state storage element 99. This means that the second output 89 of the first decoder stage 86 is at a high logic level H whereas, the first, third and fourth outputs 88, 90, 91 of the first decoder stage 86 have a low logic level L. The first terminal 80 of the second group of NAND-gates thus receives a high logic level H. As a result thereof, the output of the second NAND-gate 70 of the second group of NAND-gates assumes a low logic level L. Consequently, the output of the first NAND-gate of this second group of NAND-gates is brought to a high logic level H so that the second controllable switch 52 is rendered conducting, as is indicated in FIG. 5. Since the second and third NAND-gates 67, 68, 73, 74, 76, 77 have correspondingly high logic levels H at their outputs in this operational state, because at least one of their inputs has a low logic level L, the outputs of the first NAND-gates 66, 72, 75 of the first, third and fourth group of NAND-gates are at a low logic level L. The output signal at the output I is thus tapped from the first tap 55 of the resistive voltage divider 58 to 61.

After an information signal for a new final state is supplied via the bus input 102 and stored via the load signal at the load signal input 103 into the second state storage element 101 and is thus available at its output 100, the start input 47 of the logic stage 29 in FIG. 3 receives the start signal for the switching operation. The case is described where the newly stored information signal has the binary-coded value 3. A high logic level H then appears at the fourth output 95 of the second decoder stage 87, whereas, the other outputs 92 to 94 of the second decoder stage 87 remain at the low logic level L. Via the second terminal 85 of the fourth group of NAND-gates, the third NAND-gate 77 of this fourth group of NAND-gates is then free for passing on the second control signal D. All other third NAND-gates 68, 71, 74 are, however, blocked via the second terminals 79, 81, 83 of the first, second and third group of NAND-gates. Since the signal at the output of the second NAND-gate 76 of the fourth group of NAND-gates assumes a high logic level on the basis of the low logic level at the first terminal 84 of the fourth group of NAND-gates, a high logic level will always be present at the control terminal 65 of the fourth controllable switch 54 and the fourth controllable switch 54 will only be rendered conducting when the output of the third NAND-gates 77 of the fourth group of NAND-gates assumes a low logic level L. This happens whenever the second control signal D reaches a high logic level H. However, in the same time intervals, the first control signal C assumes a low logic level L so that in these time intervals a high logic level H occurs at the output of the second NAND-gate 70 of the second group of NAND-gates. This involves a low logic level L in these time intervals at the control terminal 63 of the second controllable switch 52, so that this switch is blocked. In said time intervals, corresponding to the pulses occurring in the control signals C, D, the arrangement switches the output terminal 1 (or the common junction point 11) from the first tap 55 to the third tap 57 of the resistive voltage divider 58 to 61. This switch-over is effected with the described temporal variations of the control signals C, D in the way of a stepwise fading from the first tap 55 to the third tap 57. After termination of the switching operation, the output signal for the output 1 is time-continuously taken from the third tap 57.

In the state now reached, in which the first control signal C constantly assumes a low logic level L and the second control signal D assumes a constant high logic level H, these values of the control signals C, D decouple all controllable switches 51 to 54 from the outputs 88 to 91 of the first decoder stage 86, so that the information signal for the initial state in the first state storage element 99 no longer has any influence on the output signal at the output 1. Consequently, the information signal for the current final state can be taken over from the output 100 of the second state storage element via its connection to the input 104 of the first state storage element 99, using the further load signal at the load signal input 105 of the first state storage element 99. The current final state thereby becomes the new initial state for a subsequent switching operation.

With this loading process, the outputs 88 to 91 of the first decoder stage 86 assume the same logic levels as the corresponding outputs 92 to 95 of the second decoder stage 87. Thus, the fourth controllable switch 54 is not only free via the fourth output 95 of the second decoder stage 87, the second terminal 85 of the fourth group of NAND-gates and the third NAND-gate 77 of the fourth group of NAND-gates, but also via the fourth output 91 of the first decoder stage 86, the first terminal 84 of the fourth group of NAND-gates and the second NAND-gate 76 of the fourth group of NAND-gates for control by the control signals C, D. Since the control signals C, D always have different logic levels, the fourth controllable switch 54 is maintained in its conducting state either via the second NAND-gate 76 or via the third NAND-gate 77 of the fourth group of NAND-gates, independently of the fact which value the control signals C, D have just assumed. Consequently, the first control signal C can be switched back to its initially high logic level H and the second control signal D can be switched back to its initially low logic level L without this having any influence on the output signal at the output 1. During this time, all other controllable switches 51, 52, 53, remain invariably blocked because all other outputs 88 to 90, 92 to 94 of the decoder stages 86, 87 are at the low logic level L. In this way, the circuit arrangement is set to a state which serves as an initial state for a further switching operation proceeding in the same way. Also the second state storage element 101 is ready for receiving a new information signal for a new final state of this subsequent switching operation.

The circuit arrangement shown in FIG. 5 comprises, in the connection between the common junction point 11 and the non-inverting input 14 of the operational amplifier 15, an arrangement comprising a series resistor 106 which can be shunted by a further controllable switch 107. A further control signal can be applied to this further controllable switch 107 via a control terminal 108. A shunt capacitor 109 is connected to ground from the junction point between the series resistor 106 and the non-inverting input 14 of the operational amplifier 15.

This switchable, i.e., partially shuntable RC combination reduces the rise time of the output signal at the common junction point 11 and at the output 1 when the further controllable switch 107 is blocked. This RC combination is only activated during the switching operations, and in the time intervals between the switching operations, the RC combination is passively switched by rendering the further controllable switch 107 conducting. Moreover, the RC combination 106, 109 supports the operation of the integration arrangement 18 which can be connected to the output 1 but, for the sake of simplicity, is not shown in FIG. 5. To control the RC combination 106, 109 via the further controllable switch 107, the control terminal 108 may be advantageously connected to the logic stage 29. A derivation of the further control signal for the control terminal 108, both from the reset signal at the reset output 41 or from the signal supplied from the signalizing output 50 and from a separate output to be provided is possible in this case.

The reset signal may be preferably formed at the reset output 41 of the logic stage 29 in that the stages, reset by this signal, of the arrangement of FIG. 3 are employed after switching the information signal from the second state storage element 101 to the first state storage element 99. This may be achieved by a corresponding implementation of the logic stage 29.

The arrangement shown in FIG. 5 constituting the run-off control stage with the logic for the digital switching operation is usable in an extended but principally unchanged form for the implementation of the arrangement of FIG. 5 with a larger number of controllable switches, as is indicated preferably when used in audio signal processing. For this purpose, for example, more than 50 controllable switches are required when used for volume control and, generally, as many as are required for permanent adjustment stages for the parameters to be adjusted (for example, the volume of an audio signal). As compared with German Patent DE 32 00 071 A1, a considerably simplified circuit arrangement is obtained by using the so-called BIMOS switches as controllable switches which can be connected in a large number to the common junction point 11. In fact, it is this structure which provides the possibility of performing a switching operation as described hereinbefore by way of example in a very simple manner between two not directly neighboring taps of the resistive voltage divider 58 to 61, thus generally a switching operation between arbitrary input signals.

Particularly for use in audio signal processing, it may, however, be desirable to switch from one input signal only to the neighboring input signal in the predetermined sequence, i.e., in the arrangement of FIG. 5, only between two neighboring taps of the resistive voltage divider. A switch from input signal to a non-neighboring input signal in the predetermined sequence, for example, from one tap to a non-neighboring tap, is then performed consecutively via each one of the intermediate input signals in the predetermined sequence (via each intermediate tap). To this end, a corresponding information signal, by which the envisaged final state always directly neighbors the initial state, can be applied after each switching operation to the second state storage element 101 via its bus input 102. Via the bus input, the sequence of information signals must thus be applied when switching between two arbitrary input signals, in correspondence with the required individual switching operations.

The number of components required for this solution in controlling the supply of information signals to the bus input 102 may be reduced in a simple and effective way in that the run-off control stage comprises a step control circuit by which the switching from the initial state to an arbitrary final state can be performed in individual switching operations between two neighboring input signals in the predetermined sequence. Via the bus input 102, only a single information signal is thus supplied for every overall control operation to the second state storage element 101 for the final state to be ultimately assumed.

Figure 6:
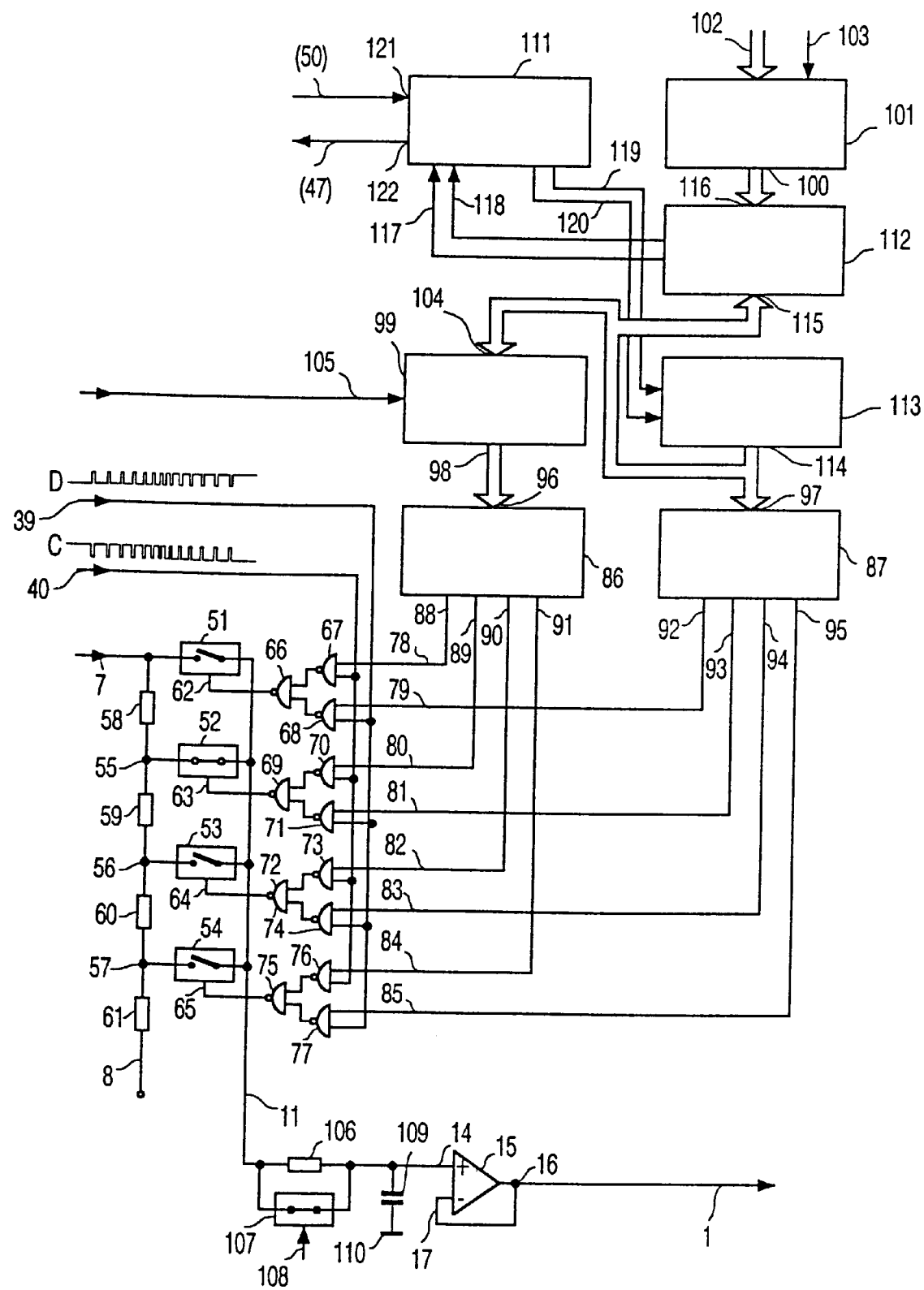
FIG. 6 shows a modification of the run-off control stage of FIG. 5, comprising a step control circuit.

Such a step control circuit is shown, by way of example, in the circuit arrangement of FIG. 6, obtained from an extension of the embodiment of FIG. 5. In contrast to the arrangement described in German Patent DE 32 00 071 A1, such a switch is basically not necessary but can be used optionally and is particularly very advantageous for simplifying control programs in audio signal processing, for example, for soft muting and volume control by means of a knob.

To this end, the embodiment of FIG. 6 comprises a step control circuit 111, a comparator 112 and an up/down-counter 113. The comparator 112 and the up/down-counter 113 complete the second state storage element 101 and modify its significance as compared with the embodiment of FIG. 5 in the way that, for each individual switching operation, the information signal for the neighboring input signal in the predetermined sequence—the subsequent input signal—is now stored in the up/down-counter 113, whereas, the information signal for the final state to be reached at the end of the overall switching operation remains invariably stored in the second state storage element 101, in its implementation described with reference to FIG. 5, during the overall switching operation, i.e., during all individual switching operations. After every individual switching operation, the information signal for the respective reached state is transferred from the up/down-counter 113 as information signal for the previous input signal into the first state storage element 99 and an information signal for a new, subsequent input signal is thereupon generated by means of a counting step in the up/down-counter 113. This process and the circuit arrangement used for this purpose will be described hereinafter.

In FIG. 6, the up/down-counter 113 has an output 114 from which the current counter position of the up/down-counter 113 is supplied, which forms an information signal for the next input signal. This is applied via a connection to the input 104 of the first state storage element 99 for take-over after the individual switching operation, as well as to a first input 115 of the comparator 112. A second input 116 of the comparator 112 is connected to the output 100 of the second state storage element 101. During the entire switching operation, the second input 116 of the comparator 112 thus receives the information signal in an unchanged form for the final state of the overall switching operation. In the comparator 112, the signals from the inputs 115, 116 are compared with each other. The result of this comparison is applied to the step control circuit 111 via a first result connection 117 and a second result connection 118. The first result connection 117 conveys a signal having information about whether the information signals at the inputs 115, 116 of the comparator 112 are equal or unequal (equality signal). The signal at the second result connection comprises information about the sign of the difference between the two information signals at the inputs 115, 116 (sign signal). Thus, the equality signal of the step control circuit 111 supplies information about whether the final state has already been reached, while the sign signal provides information about the direction of the individual switching operation to be performed next. An up-counting signal and a down-counting signal are generated in the step control circuit 111 and applied via an up-counting connection 119 and a down-counting connection 120 to the up-counting input and the down-counting input, respectively, of the up/down-counter 113. This is done in such a way that, by each counting step of the up/down-counter 113 between two individual counting operations, the current counting position is further approximated by one counting step to the information signal about the final state. In this way, the individual switching operations between the leading input signal and the trailing input signal cyclically alternate the supply of the information signal taken from the up/down-counter 113 via this relevant trailing input signal to the first state storage element 99 with the comparison of said current counting position of the up/down-counter 113 with the information signal from the second state storage element 101 in the comparator 112 and the next counting step derived therefrom by means of the step control circuit 111, until the information signal in the first state storage element 99 has assumed the value of the signal in the second state storage element 101. Also the current counting position of the up/down-counter 113 then corresponds to this information signal, whereupon—under the control of comparator 12—the step control circuit 111 terminates the overall switching operation.

To realize the described process of functions, the signals from the signaling output 50 of the logic stage 29, with which the termination of a switching operation is signaled, are evaluated in the step control circuit 111, as well as a start signal for initiating a further switching operation is generated and applied to the logic stage 29. To this end, a signaling input 121 of the step control circuit 111 is connected to the signaling output 50 of the logic stage 29, and the step control circuit 111 supplies the start signal at a start output 122 which is connected to the start input 47 of the logic stage 29. Also these functions must be taken over by the bus control when using the embodiment of FIG. 5, via which bus control the bus input 102 and the load signal input 103 are supplied with corresponding signals.

In a preferred dimensioning example, the RC combination 106, 109 is dimensioned in such a way that the rise time of the operational amplifier 15 is reduced by the RC combination by a factor of 2 to 3 as compared with operation without circuitry. This reliably prevents possible dynamic overdrive of the operational amplifier 15 and thus prevents a non-linear distortion of the switching operation. Particularly, the series resistor 106 should be dimensioned considerably larger than the internal resistance of the resistive voltage divider 58 to 61 so that the dynamic load of this resistive voltage divider is reduced.

When using the circuit arrangement according to the invention in audio signal processing, an audible improvement of the audio signal quality becomes manifest, particularly when rapidly muting an audio signal having a large amplitude.

In a further implementation of the embodiments of FIGS. 5 and 6, a combination form is also possible in which a switching operation can be performed between two arbitrary input signals, on the one hand, and two neighboring input signals, on the other hand. The choice between these two function processes may be made dependent, for example, on the amplitude of the input signal to be processed. For example, in the range of small amplitudes, the differences between the amplitudes of the input signals between which the switching operation should be performed may be chosen to be larger than in the range of higher amplitudes of the input signals.

What is claimed is:

1. A circuit arrangement for generating an output signal by combining at least a first and a second input signal, said circuit arrangement comprising:

inputs for receiving said at least first and second input signals;

controllable switches coupled, respectively, to said inputs; and an output coupled to outputs of said controllable switches, said controllable switches applying a respective one of the at least first and second input signals to the output, wherein, for switching the output from one of the at least first and second input signals to another of the at least first and second input signals, a first controllable switch of the controllable switches is gradually switched from a blocked to a conducting state and a second controllable switch of the controllable switches is switched complementarily to the first controllable switch from the conducting to the blocked state, characterized in that said circuit arrangement further comprises:

means for controlling the first and second controllable switches to switch oppositely to each other between a completely conducting state and a completely blocked state with a mutually complementary, gradually increasing/decreasing duty cycle.

2. The circuit arrangement as claimed in claim 1, characterized in that said circuit arrangement further comprises an integration arrangement, connected to the output of said circuit arrangement, for integrating or low-pass filtering the output signal.

3. The circuit arrangement as claimed in claim 1, characterized in that said controlling means controls said controllable switches to switch the output from one of the input signals to the other of the input signals within a switching interval having a predeterminable duration.

4. The circuit arrangement as claimed in claim 1, characterized in that said controlling means comprises a control arrangement for generating two mutually complementary control signals for complementarily switching the controllable switches.

5. The circuit arrangement as claimed in claim 4, characterized in that the control signals comprise pulse density or pulse frequency-controlled pulse signals.

6. The circuit arrangement as claimed in claim 5, characterized in that the control arrangement changes the pulse density or pulse frequency of the control signals in a stepwise manner.

7. The circuit arrangement as claimed in claim 6, characterized in that said control arrangement uses exclusively frequencies outside the audible frequency range both for the pulse density or pulse frequency of the control signals, and for the repetition frequency of steps in the stepwise change of the pulse density or pulse frequency of the control signals.

8. The circuit arrangement as claimed in claim 4, characterized in that the control arrangement comprises:
   a counting stage;
   an accumulation circuit for receiving output data signals from the counting stage for up-accumulation;
   a bistable D-flip-flop controlled by a carry signal from the accumulation circuit; and
   means for generating a common clock signal for clocking the counting stage, the accumulation circuit and the bistable D-flip-flop, the complementary control signals being supplied by outputs of the bistable D-flip-flop.

9. The circuit arrangement as claimed in claim 8, characterized in that said means for generating a common clock signal comprises an adjustable clock frequency divider stage for applying the clock signal to the counting stage.

10. The circuit arrangement as claimed in claim 1, characterized in that said circuit arrangement comprises at least three controllable switches for applying respective input signals, in which the controlling means controls the at least three controllable switches to switch the output from one of the input signals to an arbitrarily selectable one of the other input signals.

11. The circuit arrangement as claimed in claim 1, characterized in that said circuit arrangement comprises at least three controllable switches for applying respective input signals arranged in a predetermined sequence in accordance with their signal levels, and the controlling means controls the at least three controllable switches to switch the output from a respective one of the input signals to only a neighboring input signals in the predetermined sequence.

12. The circuit arrangement as claimed in claim 10, characterized in that said controlling means comprises a control arrangement having a run-off control stage which, starting from an initial state of the circuit arrangement in which a first selected input signal is applied to the output, receives an information signal about a second selected input signal via a data transmission path, said information signal being applied to the output in a final state of the circuit arrangement after switching said output.

13. The circuit arrangement as claimed in claim 12, characterized in that the run-off control stage comprises a first state storage element for storing an information signal for the initial state, and a second state storage element for storing an information signal for the final state.

14. The circuit arrangement as claimed in claim 13, characterized in that the information signals cause the controlling means to control the controllable switches to select the input signals to be applied to the output in the initial state and the final state, and to perform the switching operation between these input signals, and in that, after performing the switching operation, the information signal for the final state is transferred from the first state storage element to the second state storage element, whereupon the first state storage element is ready for applying a new information signal for a new final state.

15. The circuit arrangement as claimed in claim 12, in which said control arrangement controls the controllable switches to switch an input signal only to a neighboring input signal in the predetermined sequence, and in which an input signal is switched to a non-neighboring input signal consecutively via each intermediate input signal in the predetermined sequence, characterized in that the run-off control stage comprises a step control circuit by which two neighboring input signals in the predetermined sequence are switched from the initial state to the final state in individual switching operations.

16. The circuit arrangement as claimed in claim 15, in which the run-off control stage comprises a first state storage element for storing an information signal for the initial state, and a second state storage element for storing the information signal for the final state, characterized in that, in each of the individual switching operations, the information signal for the input signal to be applied to the output at the start of this individual switching operation is stored in the first state storage element, and in that the information signal for the neighboring input signal in the predetermined sequence is stored in the second state storage element.

17. The circuit arrangement as claimed in claim 16, in which the information signals cause the controllable switches to select the input signals to be applied to the output in the initial state and the final state, and to perform the switching operation between these input signals, and in that, after performing the switching operation, the information signal for the final state is transferred from the first state storage element to the second state storage element, whereupon the first state storage element is ready for applying a new information signal for a new final state, characterized in that, in each of the individual switching operations, the information signals select the leading input signal or the trailing input signal, and the individual switching operation between these input signals is performed, and in that, after performing this individual switching operation, the information signal for the trailing input signal is transferred from the first state storage element to the second state storage element, whereupon the first state storage element is ready for applying the information signal for the next neighboring input signal in the predetermined sequence until the information signal for the final state has been transferred to the second state storage element.

18. The circuit arrangement as claimed in claim 1, characterized in that the input signals are derived by level gradation from a common input signal.

19. A signal-processing device, characterized in that said signal-processing device comprises the circuit arrangement as claimed in claim 1.

20. The signal-processing device as claimed in claim 19, characterized in that said signal-processing device processes audio signals.

* * * * *